(12) United States Patent
Felde et al.

(10) Patent No.: US 10,985,506 B2
(45) Date of Patent: Apr. 20, 2021

(54) INTERFACE ARRANGEMENT WITH PROTECTION AGAINST ELECTROMAGNETIC RADIATION AND COMPUTER SYSTEM USING A METHOD OF ASSEMBLING THE SAME

(71) Applicant: Fujitsu Client Computing Limited, Kawasaki (JP)

(72) Inventors: Waldemar Felde, Munich (DE); Bernhard Kannler, Munich (DE); Werner Sausenthaler, Munich (DE)

(73) Assignee: Fujitsu Client Computing Limited, Kawasaki (JP)

( * ) Notice: Subject to any disclaimer, the term of this patent is extended or adjusted under 35 U.S.C. 154(b) by 12 days.

(21) Appl. No.: 16/431,910

(22) Filed: Jun. 5, 2019

(65) Prior Publication Data

US 2019/0379166 A1    Dec. 12, 2019

(30) Foreign Application Priority Data

Jun. 8, 2018 (DE) ...................... 10 2018 113 724.9

(51) Int. Cl.
*H01R 13/6594* (2011.01)
*H01R 13/6581* (2011.01)
(Continued)

(52) U.S. Cl.
CPC ..... *H01R 13/6594* (2013.01); *H01R 13/6581* (2013.01); *H01R 13/6595* (2013.01);
(Continued)

(58) Field of Classification Search
CPC ............ H01R 13/6594; H01R 13/6581; H01R 12/724; H01R 13/658; H01R 12/716;
(Continued)

(56) References Cited

U.S. PATENT DOCUMENTS 5,194,010 A * 3/1993 Dambach ............... H01R 12/57
 439/499
5,755,595 A * 5/1998 Davis ................. H01R 13/6582
 439/607.01

(Continued)

FOREIGN PATENT DOCUMENTS

DE    3335664 A1    4/1985
DE   199 49 989 A1    6/2000
EP    0 180 284 A2    5/1986

OTHER PUBLICATIONS

Great Britain Search Report dated Nov. 26, 2019, of counterpart Great Britain Application No. GB1908097.7.

*Primary Examiner* — Abdullah A Riyami
*Assistant Examiner* — Justin M Kratt
(74) *Attorney, Agent, or Firm* — DLA Piper LLP (US)

(57) ABSTRACT

An interface arrangement (1) includes a plug connector (4) arranged on an interface board (3). Furthermore, the interface arrangement (1) includes an electrically conductive cover (10) at least partially surrounding the plug connector (4). The electrically conductive cover (10) is adapted to seal an interface opening of the housing, in which opening the plug connector (4) can be arranged, against electromagnetic radiation. The electrically conductive cover (10) includes at least one tab (19) with a latching device. The interface board (3) includes at least one receiving device, which is adapted to receive the at least one tab (19) and to latch with the latching device. A computer system with such an interface arrangement (1), and a method for assembling such an interface arrangement (1).

9 Claims, 3 Drawing Sheets

(51) Int. Cl.
*H01R 13/6595* (2011.01)
*H01R 13/6598* (2011.01)
*H01R 12/70* (2011.01)
*H01R 12/72* (2011.01)
*G06F 1/18* (2006.01)
*H05K 9/00* (2006.01)
*H01R 13/648* (2006.01)
*H01R 13/658* (2011.01)
*H01R 12/71* (2011.01)
*H01R 13/6587* (2011.01)
*H01R 13/66* (2006.01)

(52) U.S. Cl.
CPC .............. *G06F 1/182* (2013.01); *G06F 1/183* (2013.01); *H01R 12/707* (2013.01); *H01R 12/7011* (2013.01); *H01R 12/712* (2013.01); *H01R 12/716* (2013.01); *H01R 12/722* (2013.01); *H01R 12/724* (2013.01); *H01R 13/648* (2013.01); *H01R 13/658* (2013.01); *H01R 13/6587* (2013.01); *H01R 13/6598* (2013.01); *H01R 13/6658* (2013.01); *H05K 9/0018* (2013.01); *H05K 9/0024* (2013.01)

(58) Field of Classification Search
CPC .............. H01R 13/6587; H01R 12/712; H01R 13/6658; H01R 13/648; H01R 12/7011
USPC .......... 439/607.01, 362, 564, 607.28, 607.35
See application file for complete search history.

(56) References Cited

U.S. PATENT DOCUMENTS

| | | |
|---|---|---|
| 6,132,253 A | 10/2000 | Wu |
| 6,264,501 B1 | 7/2001 | Hung et al. |
| 6,364,706 B1 | 4/2002 | Ando et al. |
| 9,004,938 B2 * | 4/2015 | Chang .................... H01R 12/50 439/541.5 |
| 2001/0049227 A1 * | 12/2001 | Zhu .................... H01R 13/6582 439/607.01 |
| 2006/0040556 A1 * | 2/2006 | Neer .................. H01R 13/6583 439/607.37 |
| 2009/0142954 A1 * | 6/2009 | Boensch ........... H01L 31/02013 439/422 |
| 2013/0280955 A1 * | 10/2013 | Alden, III ......... H01R 13/6594 439/607.28 |
| 2015/0255905 A1 * | 9/2015 | Little ................. H01R 13/6658 439/78 |

\* cited by examiner

INTERFACE ARRANGEMENT WITH PROTECTION AGAINST ELECTROMAGNETIC RADIATION AND COMPUTER SYSTEM USING A METHOD OF ASSEMBLING THE SAME

TECHNICAL FIELD

The present invention relates to an interface arrangement, comprising a plug connector arranged on an interface board. Furthermore, the present invention comprises a computer system with such an interface arrangement and a method for assembling such an interface arrangement.

BACKGROUND

Housings of computer systems frequently have interface openings in which plug connectors of an interface arrangement are arranged. A problem with interface openings of this kind is that they represent a weak point in the electromagnetic shielding of the computer housing. Electromagnetic radiation can enter the housing and/or emerge from the housing through the interface opening.

The object of the present invention is to describe an interface arrangement, a computer system and a method for assembling an interface arrangement that solve or lessen the aforesaid problem.

SUMMARY

According to a first aspect, the aforesaid object is achieved by an interface arrangement comprising a plug connector arranged on an interface board. The interface arrangement further comprises an electrically conductive cover at least partially surrounding the plug connector. The electrically conductive cover is adapted to seal an interface opening of a housing, in which opening the plug connector can be arranged, against electromagnetic radiation. The electrically conductive cover has at least one tab with a latching device. The interface board has at least one receiving device, which is adapted to receive the at least one tab and to latch with the latching device.

The at least one tab with the latching device and the at least one receiving device facilitate a connection or separation of the electrically conductive cover and the interface board without tools. The electrically conductive cover can thus be prefixed on the interface board without connection means such as screws, rivets or adhesives, for example, being required for this. This prefixing is adequate for transporting the components from one manufacturing location to a location at which the components are to be assembled finally, for example.

In at least one configuration the interface board has at least one first opening. The electrically conductive cover has at least a second opening. The at least one first opening and the at least one second opening are arranged concentrically above one another when the latching device is latched with the receiving device.

It is advantageous in this case that the prefixing of the electrically conductive cover to the interface board also enables a simple and time-saving attachment of the two components, for example to a system board of a computer system, in a final assembly. The electrically conductive cover and the interface board are positioned by the prefixing in such a way that a screw can be led simultaneously through the at least one first and the at least one second opening.

In at least one configuration the plug connector is arranged in a front area on a first lateral edge of the interface board. The at least one receiving device is arranged in at least one area of at least one other lateral edge of the interface board. The electrically conductive cover has at least one lateral arm, which extends from a main extension plane of the electrically conductive cover in the direction of the at least one receiving device. The at least one tab is arranged at a free-standing end of the at least one lateral arm.

The electrically conductive cover can be connected stably in this way to the interface board. Furthermore, it is thus possible to arrange the receiving device at a free point according to a board layout of the interface board regardless of how far the receiving device lies away from a main extension plane of the cover.

In at least one configuration the at least one lateral arm has a U-shaped recess in the front area of the interface board, which recess encloses the first lateral edge on three sides.

This offers a limit stop of the electrically conductive cover onto the interface board and ensures additional stability of the electrically conductive cover in the interface arrangement. For example, the electrically conductive cover abuts the first lateral edge on the interface board. This limit stop is also advantageous as when the cover is introduced into the interface arrangement, it aligns the at least one tab of the electrically conductive cover to the receiving device of the interface board, at least in the limit stop direction, so that an uncomplicated connection of the at least one tab with the at least one receiving device is enabled.

In at least one configuration the electrically conductive cover is produced at least partially from spring steel.

This permits elastic deformation of the electrically conductive cover, in particular in the area of the at least one tab, so that even repeated connection and separation of the at least one tab to and from the at least one receiving device does not cause permanent deformation of the cover.

According to a second aspect, the aforesaid task is solved by a computer system comprising a housing and at least one interface arrangement according to the first aspect. The interface arrangement is arranged in an area of the housing in which the housing has an interface opening.

In at least one configuration the computer system further comprises a system board, on which at least one attachment device is arranged, wherein the electrically conductive cover and the interface board are adapted to be attached to the at least one attachment device.

It is advantageous here that the electrically conductive cover and the interface board can be attached simultaneously to the system board. For example, the attachment device has an internal thread, so that the electrically conductive cover and the interface board can be attached to the attachment device by means of a screw. Alternatively, the attachment device is configured as an opening, for example, through which a screw can be led in order to be attached to a housing base. Time expenditure for assembly is reduced in this way, for example. In particular, the at least one attachment device is grounded and the at least one screw is electrically conductive, so that the electrically conductive cover is connected to the grounding of the attachment device via the at least one screw. A ground contact is guaranteed in this way between the cover and the attachment device directly via a single screw, which ensures low transfer resistance and thus good grounding of the cover.

According to a third aspect, the aforesaid task is solved by a method for assembling an interface arrangement. The interface arrangement comprises a plug connector and an electrically conductive cover at least partially surrounding the plug connector, which cover is adapted to seal an interface opening of a housing, in which opening the plug connector can be arranged, against electromagnetic radiation. The method comprises the steps:

attachment of the plug connector to an interface board (3) having at least one receiving device; and attachment of the electrically conductive cover (10) by means of at least one tab (19) having a latching device to the interface board (3), in that the at least one tab (19) is received in the at least one receiving device, and the at least one latching device latches with the at least one receiving device.

Other advantageous configurations are described in the attached claims and the following description of the attached figures. In the figures the same reference signs are used for elements with substantially the same function, but these elements do not have to be identical in all details.

REFERENCE SIGN LIST

Figure 1:
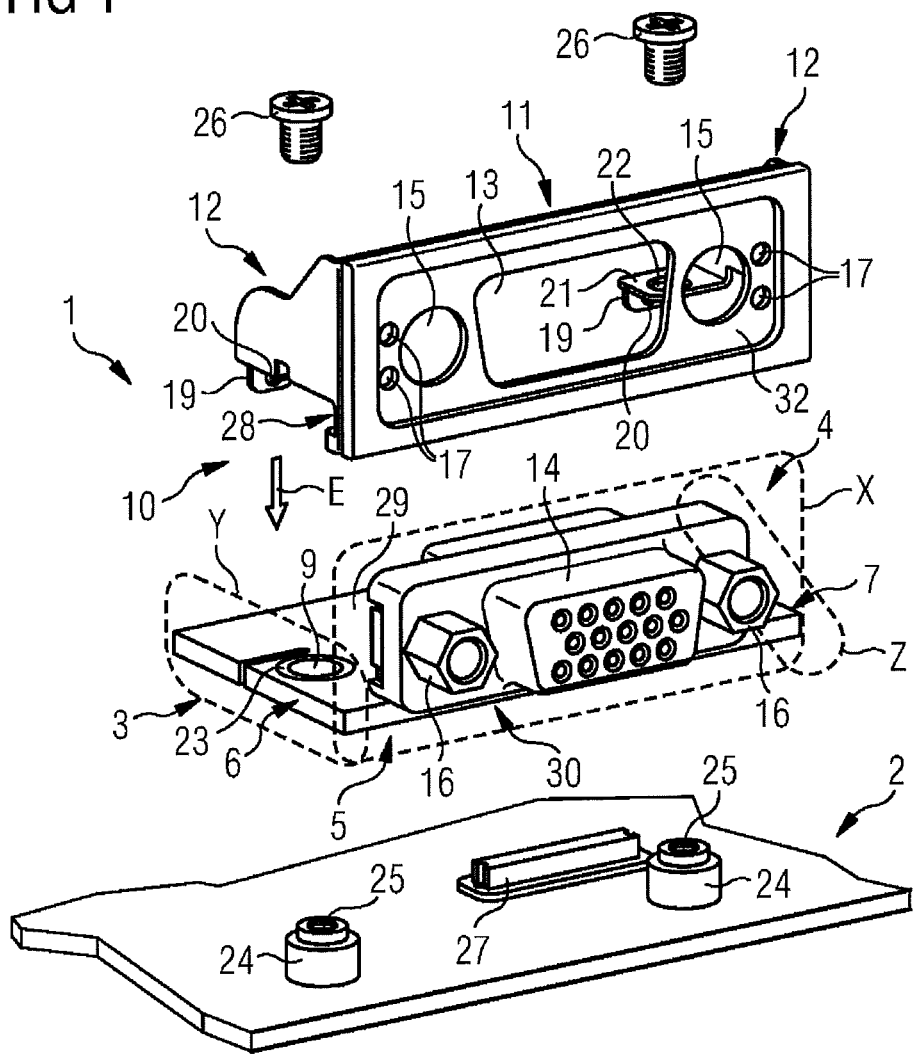
FIG. 1 shows an exploded diagram of an interface arrangement on a system board according to a first configuration of the invention.
Figure 2:
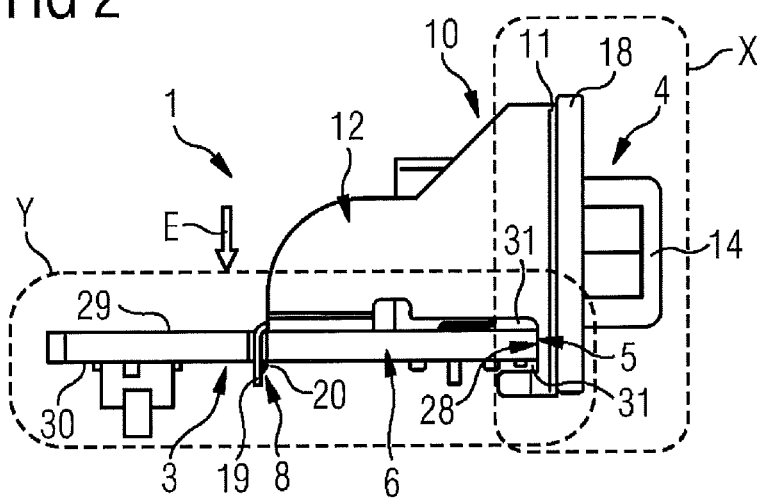
FIG. 2 shows a side view of the interface arrangement according to FIG. 1, FIGS. 3A-D show various states of assembly of the interface arrangement according to FIG. 1.
Figure 3A:
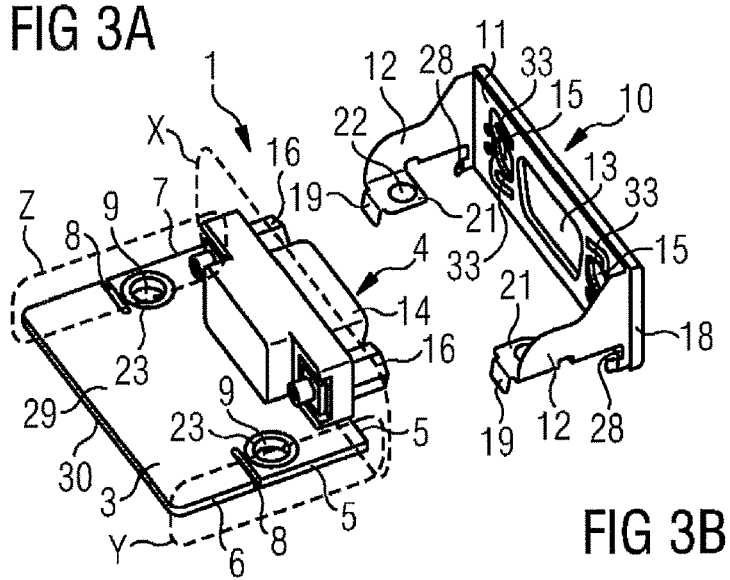
Figure 3B:
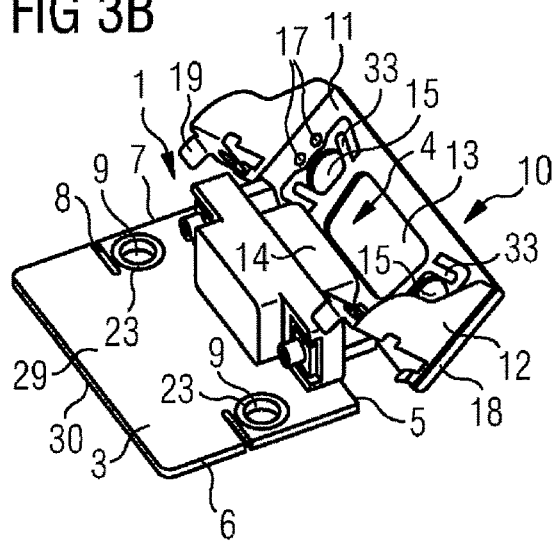
Figure 3C:
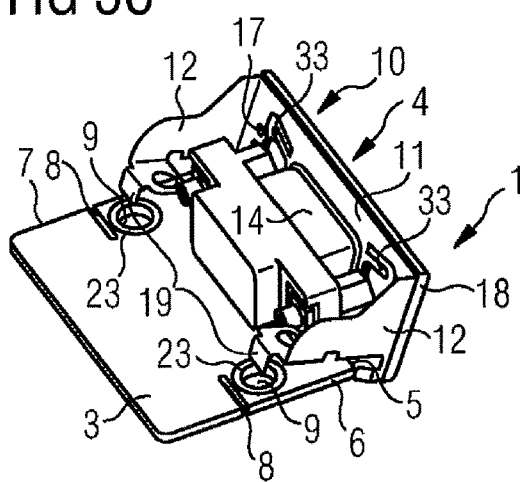
Figure 3D:
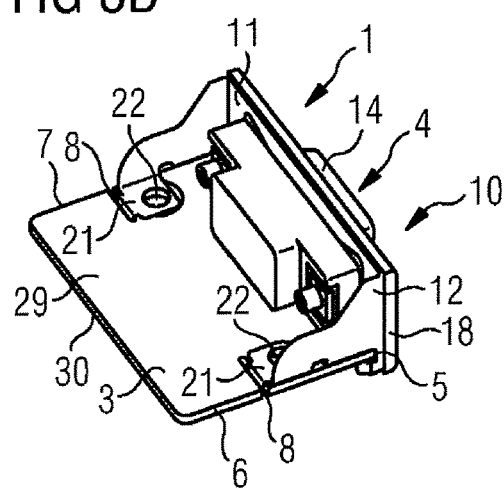

1 Interface arrangement
2 System board
3 Interface board
4 Plug connector
5 First lateral edge
6 Second lateral edge
7 Third lateral edge
8 Slot-shaped recess
9 First opening
10 Electrically conductive cover
11 Shielding plate
12 Lateral arm
13 Third opening
14 Connection part of the plug connector
15 Fourth opening
16 Attachment bolt
17 Press point
18 Electrically conductive gasket
19 Tab
20 Projection
21 Protrusion
22 Second opening
23 Ground contact
24 Spacer bolt
25 Internal thread
26 Screw
27 Edge connector
28 U-shaped recess
29 Upper side of the interface board
30 Lower side of the interface board
31 Air gap
32 Front panel
33 Contact tongues A State
B State
C State
D State
E Insertion direction
X Front area
Y Area of first lateral edge
Z Area of second lateral edge

DETAILED DESCRIPTION

FIGS. 1 to 3D show an interface arrangement 1 according to a first configuration of the invention in various states and views. In addition to the interface arrangement 1, FIG. 1 shows a part of a system board 2, on which the interface arrangement 1 can be attached. In the following, FIGS. 1 to 3D are described jointly.

The interface arrangement 1 comprises an interface board 3 and an electrically conductive cover 10. On the interface board 3 a plug connector 4 according to the Video Graphics Array (VGA) Standard is soldered. The plug connector 4 is connected both mechanically and electrically to the interface board 3 in a front area X. The front area X lies in an area of a first lateral edge 5 of the interface board 3. The interface board 3 also has interface electronics, which are not shown here. The interface board 3 enables a modular construction of a computer system with respect to an interface standard. Such an interface board 3, which represents a connecting piece between the plug connector 4 and the system board 2, makes it possible to install different interface arrangements, according to desired interface standards, in computer systems with identical system boards 2.

On a second lateral edge 6 lying adjacent to the first lateral edge 5 and on a third lateral edge 7 lying opposite the second lateral edge 6 the interface board 3 has a slot-shaped recess 8 in each case. The interface board 3 also has two first openings 9, one of which is arranged in an area Y of the second lateral edge 6 and one in an area Z of the third lateral edge 7.

The electrically conductive cover 10 consists of a shielding plate 11 and two lateral arms 12. The lateral arms 12 extend from opposite ends of the shielding plate 11 along the second and third lateral edge 6, 7 in the direction of the slot-shaped recesses 8. At the ends of the lateral arms 12 facing away from the shielding plate 11, the lateral arms 12 have tabs 19 angled in the direction of the interface board 3. The tabs 19 are configured in such a way that they can be inserted into the slot-shaped recesses 8 along an insertion direction E.

Perpendicular to the insertion direction E the tabs 19 have a projection 20. The projections 20 are arranged on the tabs 19 so that they protrude on a side of the interface board 3 facing away from the lateral arms 12 when the tabs 19 are fully inserted into the slot-shaped recesses 8. The projections 20 protrude from the tabs 19 so far that the tabs 19 with the projections 20 can be inserted into the slot-shaped recesses 8 and when the tabs 19 are fully inserted, the projections 20 prevent an independent release of the tabs 19 from the slot-shaped recesses 8.

The electrically conductive cover 10 is manufactured from spring steel. The electrically conductive cover 10 can thus be bent elastically during assembly of the interface arrangement 1 without being deformed plastically.

The shielding plate 11 has a third opening 13, through which a connection part 14 of the plug connector 4 can be led. Furthermore, the shielding plate 11 has two fourth openings 15, through which attachment bolts 16 can be led for mechanical coupling of the plug connector 4 to a plug. Also attached to a side of the shielding plate 11 facing away from the interface board 3 is a front panel 32. The front panel 32 extends parallel to the shielding plate 11 of the cover 10 and is pressed to the cover 10 at four pressing points 17. The front panel 32 likewise has the third and fourth openings 13, 15 and serves for additional shielding and stability.

Additionally glued to the side of the shielding plate 11 facing away from the interface board 3 is an electrically conductive seal 18, also known as a "gasket." The gasket 18 lies on the shielding plate 11 in an edge area. If the interface arrangement 1 is installed in a housing, for example of a computer system, the gasket 18 presses from inside against the housing and thus creates an electrical contact between a housing plate and the electrically conductive cover 10.

The shielding plate 11 also has contact tongues 33, which are bent forwards in the direction of the plug connector 4. These contact tongues 33 contact the plug connector 4 and in this way additionally reduce radiation or the take-up of electromagnetic radiation. Since the contact tongues 33 are also manufactured from spring steel, they are likewise elastically deformable. Since the contact tongues 33 are bent forward in the direction of the plug connector 4, contacting of the cover 10 and the plug connector 4 is ensured, even in the case of tolerances in the interface arrangement 1.

At the ends of the lateral arms 12 facing away from the shielding plate 11, the lateral arms 12 also have a protrusion 21 extending parallel to a main extension plane of the interface board 3. These protrusions 21 each have a second opening 22. The second openings 22 and the first openings 9 lie concentrically above one another when the tabs 19 are inserted into the slot-shaped recesses 8.

Arranged in two first openings 9 respectively is a sleeve-shaped ground contact 23 of the interface board 3. The sleeve-shaped ground contact 23 rests on the protrusions 21 when the tabs 19 are plugged into the slot-shaped recesses 8. Electrical contact is created in this way between the electrically conductive cover 10 and the ground contacts 23.

At an end of the lateral arms 12 facing the shielding plate 11, the lateral arms 12 each have a U-shaped recess 28 at the level of the interface board 3 that is open towards the first lateral edge 5. This U-shaped recess 28 is dimensioned so that the first lateral edge 5 touches the lateral arms 12 when the tabs 19 are plugged into the slot-shaped recesses 8. This affords additional stability and slip resistance of the electrically conductive cover 10 in relation to the interface board 3.

Air gaps 31 exist between an upper side 29 and a lower side 30 of the interface board 3 and the U-shaped recess 28. These permit tilting of the electrically conductive cover 10 in relation to the interface board 3 for introduction of the tabs 19 into the slot-shaped recesses 8. This is shown in FIG. 3 by means of states B and C.

In addition to the interface arrangement 1, FIG. 1 shows a part of a system board 2, to which the interface arrangement 1 can be attached. To attach the interface arrangement 1 mechanically, two spacer bolts 24 are mounted on the system board 2, which each have an internal thread 25. The spacer bolts 24 point in the direction of the interface board 3 and are spaced so that the internal threads 25 of the spacer bolts lie concentrically beneath the first openings 9 and the second openings 22. The entire interface arrangement 1 can thus be attached to the system board 2 by means of screws 26, which are each led through the first openings 9 and the second openings 22 and screwed into the internal threads 25. Only one screw is used in each case here to connect both the electrically conductive cover 10 and the interface board 3 to the system board 2 at one point.

For electrical connection of the interface arrangement 1 to the system board 2, the system board 2 has an edge connector 27, which is connected to a corresponding counterpart, not shown here, on the interface board 3.

Figure 4:
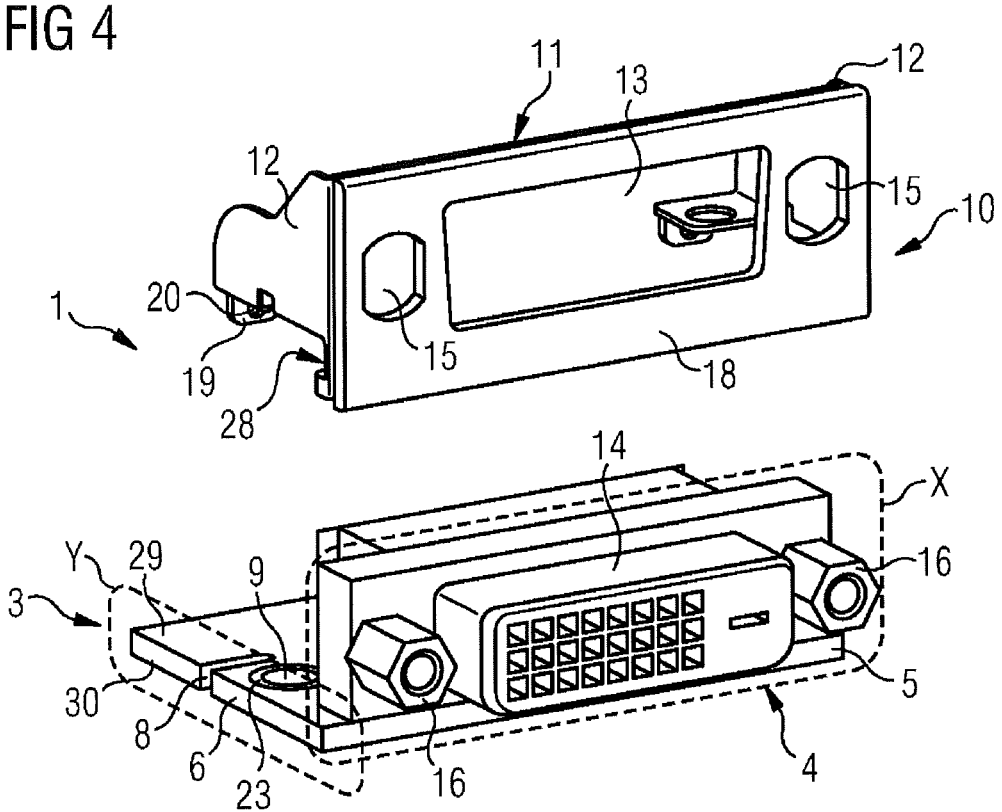
FIG. 4 shows an interface arrangement according to a second configuration of the invention.
Figure 5:
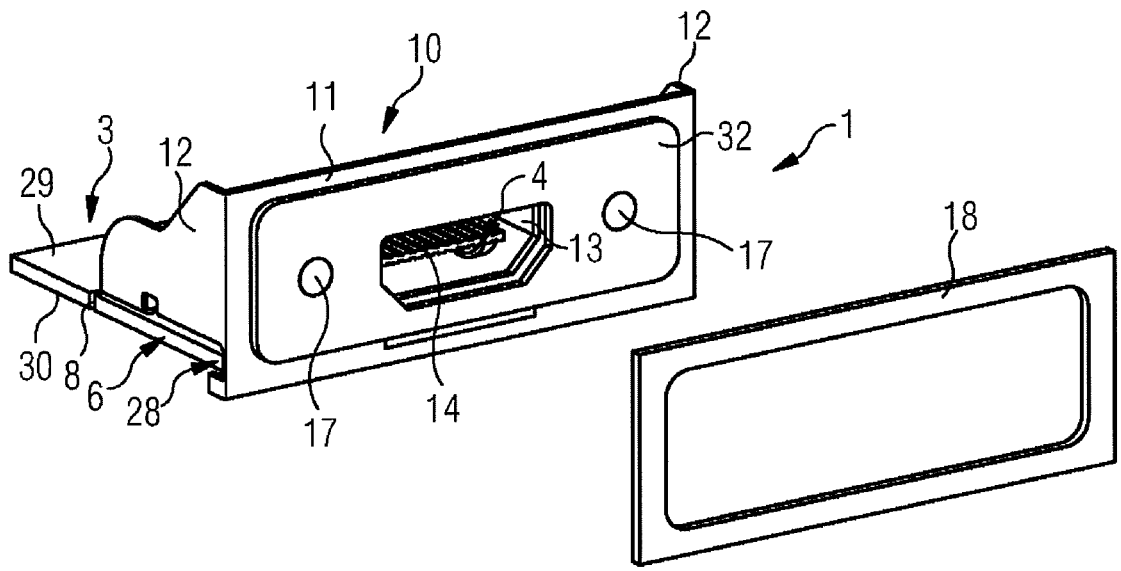
FIG. 5 shows an interface arrangement according to a third configuration of the invention.

FIGS. 4 and 5 show interface arrangements 1 according to a second and a third configuration of the invention. FIG. 4 shows an interface arrangement 1 with a plug connector 4 according to the Digital Visual Interface (DVI) Standard. FIG. 5 shows an interface arrangement 1 with a plug connector 5 according to the High Definition Multimedia Interface (HDMI) Standard. Naturally even other plug connectors, even of non-graphical interfaces, can be used by analogy in interface arrangements of this kind. Interface boards with a desired plug connector can be selected as required for installation in a computer system. These can be attached interchangeably to the system board 2 shown in FIG. 1. Various interfaces according to different interface standards can thus be installed in a modular manner in a computer system with the system board 2. Depending on the desired interface standard a suitable interface board 3 is selected with a corresponding plug connector 4 and a matching cover 10.

The features of the interface arrangements 1 according to FIGS. 4 and 5 substantially correspond to the features of the interface arrangement 1 according to FIGS. 1 to 3D. Only differences between the various exemplary embodiments are considered below. Features that are shown by means of one of the exemplary embodiments can be combined or exchanged with one another arbitrarily in a sensible manner.

The interface arrangement 1 according to FIG. 4 differs from the interface arrangement 1 according to FIGS. 1 to 3D in that no front panel is attached to the electrically conductive cover 10. The electrically conductive gasket 18 extends over the entire shielding plate 11. The gasket 18 has third and fourth openings corresponding to the third and fourth openings 13, 15 of the shielding plate 11.

The interface arrangement 1 according to FIG. 5 has no fourth openings in the shielding plate 11, as the HDMI plug connector 4 has no attachment bolts. Since larger press points 17 are thus possible, only two press points 17 are used in this exemplary embodiment 17 to attach the front panel 32 to the cover 10. In this figure a form of the front panel 32 is to be recognized, furthermore, as the electrically conductive gasket 18 is depicted detached from the shielding plate 11. The front panel 32 according to FIGS. 1 to 3D corresponds in its shape roughly to the front panel 32 depicted in FIG. 5.

The invention claimed is:

1. An interface arrangement comprising:
a plug connector arranged on an interface board; and
an electrically conductive cover at least partially surrounding the plug connector and adapted to seal an interface opening of a housing in which the plug connector can be arranged against electromagnetic radiation;
wherein
the electrically conductive cover comprises at least one tab with a latching device;
the interface board comprises at least one receiving device adapted to receive the at least one tab and to latch with the latching device;
the plug connector is arranged in a front area on a first lateral edge of the interface board;
the at least one receiving device is arranged in at least one area of at least one other lateral edge of the interface board;

the electrically conductive cover comprises at least one lateral arm extending laterally from the electrically conductive cover in a direction of the at least one receiving device;

the at least one tab is arranged at a free-standing end of the at least one lateral arm; and the at least one lateral arm comprises in the front area of the interface board a U-shaped recess that encloses the first lateral edge on three sides.

2. The interface arrangement according to claim 1, wherein the at least one receiving device is configured as a slot-shaped recess so that the at least one tab is insertable into the slot-shaped recess along an insertion direction; and the latching device is configured as a projection in a direction perpendicular to the insertion direction on the tab.

3. The interface arrangement according to claim 1, wherein the interface board comprises at least one first opening;

the electrically conductive cover comprises at least one second opening; and the at least one first opening and the at least one second opening are arranged concentrically above one another when the latching device is latched with the receiving device.

4. The interface arrangement according to claim 3, wherein the at least one first opening is enclosed by at least one ground contact; and the at least one ground contact is configured so that the at least one ground contact is in contact with a part of the electrically conductive cover when the latching device is latched with the receiving device.

5. The interface arrangement according to claim 1, wherein also mounted on the electrically conductive cover is an electrically conductive gasket adapted to create an electrical contact between the electrically conductive cover and the housing in which the interface arrangement is arranged.

6. The interface arrangement according to claim 1, wherein the electrically conductive cover is at least partially manufactured from spring steel.

7. A computer system comprising:
the housing; and
the interface arrangement according to claim 1;
wherein the interface arrangement is arranged in an area of the housing in which the housing comprises an interface opening sealed against electromagnetic radiation by the electrically conductive cover.

8. The computer system according to claim 7, further comprising a system board, on which at least one attachment device is arranged, wherein the electrically conductive cover and the interface board are adapted to be attached to the at least one attachment device.

9. A method of assembling an interface arrangement comprising a plug connector and an electrically conductive cover at least partially surrounding the plug connector and adapted to seal an interface opening of a housing in which the plug connector can be arranged against electromagnetic radiation, the method comprising:

attaching the plug connector to an interface board having at least one receiving device, wherein the plug connector is attached in a front area on a first lateral edge of the interface board and the at least one receiving device is arranged in at least one area of at least one other lateral edge of the interface board; and attaching the electrically conductive cover by at least one tab having a latching device to the interface board, wherein the at least one tab is received in the at least one receiving device, and the at least one latching device latches with the at least one receiving device, the electrically conductive cover comprises at least one lateral arm extending laterally from the electrically conductive cover in a direction of the at least one receiving device, the at least one tab is arranged at a free-standing end of the at least one lateral arm, and the at least one lateral arm comprises in the front area of the interface board a U-shaped recess that encloses the first lateral edge on three sides.

* * * * *